(12) United States Patent
Loh

(10) Patent No.: US 7,692,206 B2
(45) Date of Patent: Apr. 6, 2010

(54) COMPOSITE LEADFRAME LED PACKAGE AND METHOD OF MAKING THE SAME

(75) Inventor: Ban P. Loh, Durham, NC (US)

(73) Assignee: CREE, Inc., Durham, NC (US)

( * ) Notice: Subject to any disclaimer, the term of this patent is extended or adjusted under 35 U.S.C. 154(b) by 211 days.

(21) Appl. No.: 10/721,654

(22) Filed: Nov. 25, 2003

(65) Prior Publication Data

US 2004/0126913 A1  Jul. 1, 2004

Related U.S. Application Data

(60) Provisional application No. 60/431,523, filed on Dec. 6, 2002.

(51) Int. Cl.
*H01L 33/00* (2010.01)
(52) U.S. Cl. .................. 257/99; 257/E33.066
(58) Field of Classification Search ................ 257/707, 257/666, 82–100, 678, 680, 431–433, E33.066; 438/51
See application file for complete search history.

(56) References Cited

U.S. PATENT DOCUMENTS

| 4,267,559 | A |   | 5/1981  | Johnson et al. |       |
|-----------|---|---|---------|----------------|-------|
| 5,173,839 | A |   | 12/1992 | Metz, Jr.      |       |
| 5,441,918 | A | * | 8/1995  | Morisaki et al.| 438/118 |
| 5,785,418 | A |   | 7/1998  | Hochstein      |       |
| 5,789,772 | A |   | 8/1998  | Jiang          |       |
| 5,841,177 | A |   | 11/1998 | Komoto et al.  |       |
| 5,869,883 | A |   | 2/1999  | Mehringer et al.|      |
| 5,959,316 | A |   | 9/1999  | Lowery         |       |

(Continued)

FOREIGN PATENT DOCUMENTS

CN       100385636 C      1/2006

(Continued)

OTHER PUBLICATIONS

United States Patent Application Entitled: Power surface mount light emitting die package U.S. Appl. No. 10/446,532, Inventor(s): Ban P. Loh filed May 27, 2003 Published date: Mar. 4, 2004.

(Continued)

*Primary Examiner*—Nathan W Ha
(74) *Attorney, Agent, or Firm*—Jenkins, Wilson, Taylor & Hunt, P.A.

(57) ABSTRACT

Light emitting die package is disclosed. The die package includes a leadframe, a bottom heatsink, a top heatsink, a reflector and a lens. The top and bottom heatsinks are thermally coupled but electrically insulated from the leadframe. The leadframe includes a plurality of leads and defines a mounting pad for mounting LEDS. The top heatsink defines an opening over the mounting pad. The reflector is coupled to the top heatsink at the opening. The lens is placed over the opening defining an enclosed cavity over the mounting pad. At least one light emitting device (LED) is mounted on the mounting pad within the cavity. Encapsulant optically couples the LED to its surrounding surfaces to maximize its optical performance. When energized, the LED generates light and heat. The light is reflected by the reflector and operated on by the lens. The heat is dissipated by the top and the bottom heatsinks.

20 Claims, 4 Drawing Sheets

U.S. PATENT DOCUMENTS

| | | | |
|---|---|---|---|
| 5,998,925 | A | 12/1999 | Shimizu et al. |
| 6,238,599 | B1 | 5/2001 | Gelorme et al. |
| 6,274,924 | B1 | 8/2001 | Carey et al. |
| 6,307,272 | B1 | 10/2001 | Takahasi et al. |
| 6,329,706 | B1 | 12/2001 | Nam |
| 6,335,548 | B1 | 1/2002 | Roberts et al. |
| 6,376,902 | B1 * | 4/2002 | Arndt .................. 257/678 |
| RE37,707 | E | 5/2002 | Bozzini et al. |
| 6,429,513 | B1 | 8/2002 | Shermer, IV et al. |
| 6,444,498 | B1 | 9/2002 | Huang et al. |
| 6,456,766 | B1 | 9/2002 | Shaw et al. |
| 6,457,645 | B1 | 10/2002 | Gardner, Jr. |
| 6,468,821 | B2 | 10/2002 | Maeda et al. |
| D465,207 | S | 11/2002 | Williams et al. |
| 6,492,725 | B1 | 12/2002 | Loh et al. |
| 6,541,800 | B2 | 4/2003 | Barnett et al. |
| 6,559,525 | B2 * | 5/2003 | Huang .................. 257/675 |
| 6,593,598 | B2 * | 7/2003 | Ishinaga .................. 257/98 |
| 6,670,648 | B2 * | 12/2003 | Isokawa et al. .......... 257/99 |
| 6,680,491 | B2 | 1/2004 | Nakanishi et al. |
| 6,707,069 | B2 * | 3/2004 | Song et al. .................. 257/79 |
| 6,888,173 | B2 * | 5/2005 | Ishii et al. .................. 257/100 |
| 2001/0045573 | A1 | 11/2001 | Waitl et al. |
| 2002/0097579 | A1 | 7/2002 | Stalions |
| 2002/0179919 | A1 * | 12/2002 | Deisenhofer et al. ......... 257/99 |
| 2003/0057573 | A1 * | 3/2003 | Sekine et al. ............... 257/787 |
| 2003/0168670 | A1 * | 9/2003 | Roberts et al. ............... 257/98 |
| 2003/0168720 | A1 | 9/2003 | Kamada |
| 2003/0193080 | A1 * | 10/2003 | Cabahug et al. ............. 257/666 |
| 2004/0079957 | A1 * | 4/2004 | Andrews et al. ............ 257/100 |
| 2004/0173804 | A1 | 9/2004 | Yu |
| 2004/0201028 | A1 * | 10/2004 | Waitl et al. .................. 257/99 |
| 2004/0238930 | A1 * | 12/2004 | Arndt .................. 257/678 |

FOREIGN PATENT DOCUMENTS

| | | |
|---|---|---|
| CN | 200380104936.9 | 4/2008 |
| DE | 19918370 | 11/2000 |
| EP | 0933823 | 1/1999 |
| EP | 0921568 A2 | 6/1999 |
| JP | 05037021 | 2/1993 |
| JP | 10-144965 | 5/1998 |
| JP | 11087780 | 3/1999 |
| JP | 11-163412 | 6/1999 |
| JP | 11-289098 | 10/1999 |
| JP | 11-298048 | 10/1999 |
| JP | 2001-144333 | 5/2001 |
| JP | 2001-148514 | 5/2001 |
| JP | 2002-93206 | 3/2002 |
| JP | 2002-539623 | 11/2002 |
| JP | 2002103977 | 10/2003 |
| JP | 2003298117 | 10/2003 |
| WO | WO 97/48184 | 12/1997 |
| WO | WO 99/07023 | 2/1999 |
| WO | WO 02/084749 | 10/2002 |

OTHER PUBLICATIONS

United States Patent Application Entitled: Power surface mount light emitting die package U.S. Appl. No. 10/692,351, Inventor(s): Peter Scott Andrews, Ban P. Loh, Durham filed Oct. 22, 2003 Published date: Apr. 29, 2004.

United States Patent Application Entitled: LED package die having a small footprint U.S. Appl. No. 10/721,641, Inventor(s): Ban P. Loh filed Nov. 25, 2003 Published date: Jul. 1, 2004.

United States Patent Application Entitled: Power light emitting die package with reflecting lens and the method of making the same U.S. Appl. No. 10/861,929, Inventor(s): Ban P. Loh, Gerald H. Negley filed Jun. 4, 2004 Published date: Not yet published.

United States Patent Application Entitled: Composite optical lens with an integrated reflector U.S. Appl. No. 10/861,639 Inventor(s): Ban P. Loh, Gerald H. Negley filed Jun. 4, 2004 Published date: Not yet published.

Supplementary European Search Report dated May 7, 2007.

Chinese Office Action with English translation dated Jun. 15, 2007.

European Patent Office—Official Action dated Mar. 3, 2008.

IPO Patent Office Action for ROC (Taiwan) Patent Application No. 092134358 dated Jul. 14, 2009.

Japanese Office Action for JP 2004-559204 dated Nov. 4, 2009 (with English Summary).

* cited by examiner

COMPOSITE LEADFRAME LED PACKAGE AND METHOD OF MAKING THE SAME

PRIORITY

This application claims the benefit of the filing date of U.S. Provisional Patent Application No. 60/431,523 filed Dec. 6, 2002 entitled "Leadframe based LED or semiconductor package with improved heat spreading" under 35 USC section 119, section 120, or both.

BACKGROUND

The present invention relates to the field of packaging semiconductor devices, and more particularly to packaging light emitting diodes.

Light emitting devices (LEDS) such as light emitting diodes are often packaged within leadframe packages. A leadframe package typically includes an LED connected to thin metal leads where the LED and most of the leads are completely encapsulated within a plastic body. A part of the plastic body defines a lens. A portion of the leads connected to the LED extends outside the plastic body. The metal leads of the leadframe package serve as the conduit to supply the LED with electrical power and, at the same time, may act to draw heat away from the LED. Heat is generated by the LED when power is applied to the LED to produce light. The portion of the leads that extend out from the package body connects to circuits external to the leadframe package.

Some of the heat generated by the LED is dissipated by the plastic package body; however, most of the heat is drawn away from the LED via the metal components of the package. The metal leads are typically very thin and have a small cross section. For this reason, capacity of the metal leads to remove heat from the LED is limited. This limits the amount of power that can be sent to the LED. This, in turn, limits the amount of light that can be generated by the LED.

To increase the capacity of an LED package to dissipate heat, various designs are used in the industry; however, each of these designs results in LED packages with limited heat dissipation capacities while increasing the complexity and the costs of manufacturing the LED packages. For example, in one approach, LED packages are designed to include the LED within a cavity of a heatsink slug. Then, the heatsink slug is surrounded by a plastic body except for its bottom surface. For example, some LUXEON™ LED packages by Lumileds Lighting, LLC embodies such a design. Here, the heatsink slug increases the capacity of the LED package to dissipate heat; however, LED packages of this design are relatively difficult and costly to manufacture. Further, the heat dissipation is limited because of its limited exposed surface (the bottom surface only).

In another LED package design, the leads of the leadframe are extended (in various shapes and configurations) beyond the immediate edge of the LED package body. This increases the surface area of the portions of the leads exposed to the surrounding air. The increased exposed surface area of the extended leads increases the capacity of the LED package to dissipate heat; however, the extended leads increase the size of the LED package requiring relatively large area on a circuit board. Circuit board area is a scarce and costly factor in many applications.

Another undesirable aspect of the current leadframe package designs relates to problems associated with thermal expansion of the package. When heat is generated, the LED package experiences thermal expansion. Each of the parts of the LED package has a different coefficient of thermal expansion (CTE). For example, the CTE of the LED, the CTE of the package body, the CTE of the leads, and the CTE of lens are different from each other. For this reason, when heated, each of these parts experience different degrees of thermal expansion resulting in mechanical stresses between the parts of the package thereby adversely affecting its reliability.

Consequently, there remains a need for an improved LED package that overcomes or alleviates one or more of the shortcomings of the prior art packages.

SUMMARY

The need is met by the present invention. In a first embodiment of the present invention, a light emitting die package includes a leadframe, a bottom heatsink and a top heatsink. The leadframe has a top side and a bottom side and includes a plurality of leads. A portion of the leadframe defines a mounting pad. The bottom heatsink is coupled to the bottom side of the leadframe. The top heatsink is coupled to the top side of the leadframe. The top heatsink defines an opening which generally surrounds the mounting pad.

In a second embodiment of the present invention, a light emitting die package includes a leadframe, a bottom heatsink and a top heatsink. The leadframe has a top side and a bottom side and includes a plurality of leads. The bottom heatsink is thermally coupled to the bottom side of the leadframe under the mounting pad. The bottom heatsink is electrically insulated from the leadframe. The top heatsink is thermally coupled to the top side of the leadframe and defines an opening which generally surrounds the mounting pad. The top heatsink is electrically insulated from the leadframe and is coupled to a reflector that also surround the mounting pad. At least one light emitting device (LED) is mounted on the mounting pad, the LED adapted to generate light when energized. A lens is coupled to the top heatsink over the opening. The lens is adapted to operate on the light generated by the LED. The lens covers the opening thereby defining an enclosed cavity.

In a third embodiment of the present invention, a method of manufacturing a light emitting die package is disclosed. First, a leadframe die is fabricated. The leadframe die includes a plurality of leads and die frame, each lead and the die frame having a top side and a bottom side. Then, a top heatsink is coupled over the leadframe die, the top heatsink defining an opening. Next, a bottom heatsink is coupled under the leadframe die. Finally, the leadframe die is stamped to cut-away the die frame.

Other aspects and advantages of the present invention will become apparent from the following detailed description, taken in conjunction with the accompanying drawings, illustrating by way of example the principles of the invention.

DETAILED DESCRIPTION

The present invention will now be described with reference to the FIGS. 1 through 3, which illustrate various embodiments of the present invention. As illustrated in the Figures, the sizes of layers or regions are exaggerated for illustrative purposes and, thus, are provided to illustrate the general structures of the present invention. Furthermore, various aspects of the present invention are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Furthermore, relative terms such as "on" or "above" are used herein to describe one structure's or portion's relationship to another structure or portion as illustrated in the Figures. It will be understood that relative terms such as "on" or "above" are intended to encompass different orientations of the device in addition to the orientation depicted in the Figures. For example, if the device in the Figures is turned over, structure or portion described as "above" other structures or portions would now be oriented "below" the other structures or portions. Likewise, if the device in the Figures is rotated along an axis, structure or portion described as "above" other structures or portions would now be oriented "next to" or "left of" the other structures or portions. Like numbers refer to like elements throughout.

As shown in the figures for the purposes of illustration, embodiments of the present invention are exemplified by a light emitting die package including a leadframe with leads, a bottom heatsink, and a top heatsink with an opening. A light emitting device (LED) such as a light emitting diode is mounted on the leadframe within the opening. A lens covers the opening. In effect, the light emitting die package according to one embodiments of the present invention comprises a two part heat sink sandwiching a leadframe. Because both the bottom and the top heat sinks draw heat away from the LED, more power can be delivered to the LED, and the LED can produce more light. Furthermore, for the same reason, the light emitting die package of the present invention may not require a separate heat sink slugs or leads that extend away from the package. Accordingly, the LED die package of the present invention may be more compact, more reliable, and less costly to manufacture than the die packages of the prior art.

Figure 1A:
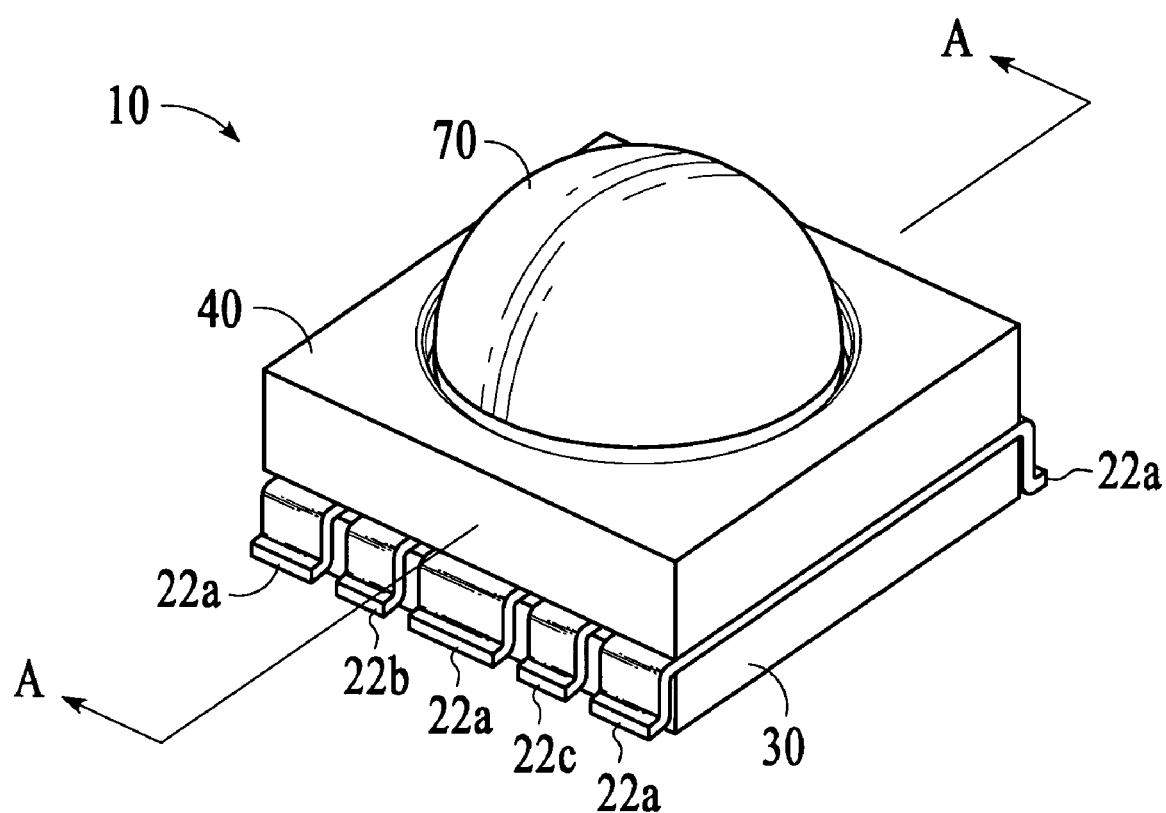
FIGS. 1A and 1B are perspective views of a light emitting die package according to one embodiment of the present invention.
Figure 1B:
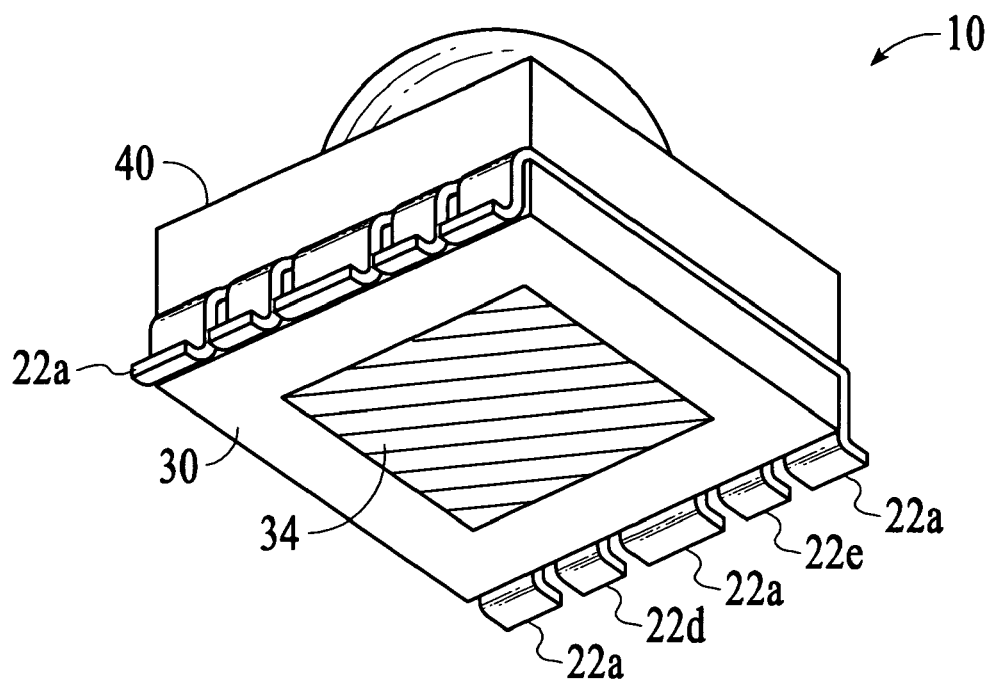
Figure 1C:
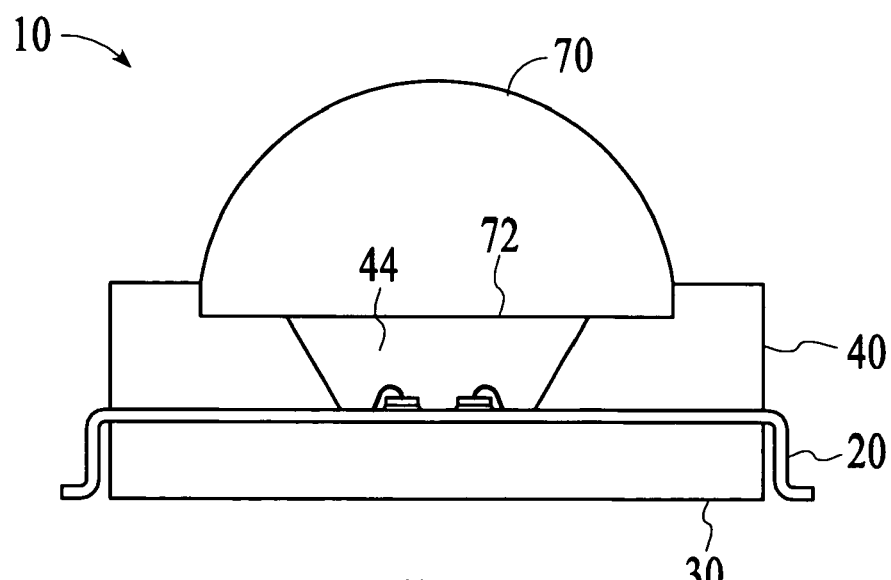
FIG. 1C is a cutaway side view of the light emitting die package of FIG. 1A cut along line A-A.

FIGS. 1A and 1B are perspective views of a light emitting die package 10 according to one embodiment of the present invention. FIG. 1C is a cutaway side view of the light emitting die package 10 of FIG. 1A cut along line A-A. FIG. 2 is an exploded perspective view of the semiconductor package 10 of FIGS. 1A and 1B. Referring to FIGS. 1A through 2, the semiconductor package 10 includes a leadframe 20, a bottom heatsink 30, and a top heatsink 40.

The leadframe 20 includes a plurality of leads. In the figures, for illustrative purposes only, leads 22a, 22b, 22c, 22d, and 22e are shown. For convenience, the leads 22a, 22b, 22c, 22d, and 22e are collectively referred to as leads 22 in this document. The leads 22a, 22b, 22c, 22d, and 22e are electrically isolated from each other. To avoid clutter, not all instances of the leads 22 are illustrated with a reference numeral in the Figures. The leadframe 20 includes a top side 24 and a bottom side 26. Further, a portion 28 of the leadframe 20 defines a mounting pad 28. The mounting pad 28 is a portion of the leadframe 20 (including a portion of the first lead 22a) where an LED assembly 50 is mounted. Typically the mounting pad 28 is generally located proximal to center of the top side 24 of the leadframe 20. In alternative embodiments of the present invention, the LED assembly 50 can be replaced by other semiconductor circuits or chips. The leadframe 20 is made of electrically conductive material and is generally thin. In one embodiment the leadframe 20 has thickness in order of thousandths or hundredths of inches, and for example, ranges from 0.005 inches to 0.010 inches.

The bottom heatsink 30 is coupled to the bottom side 26 of the leadframe 20 at least under the mounting pad 28. The bottom heatsink 30 is made of thermally conductive material and is thermally coupled to the bottom side 26 of the leadframe 20 but is electrically separated from the leadframe 20. The bottom heatsink 30 has a top surface 32 thermally coupled to but is electrically separated from the leadframe 20, the electrical separation can be accomplished by using a dielectric layer between the leadframe 20 and the bottom heatsink 30, for example, adhesive filled with ceramic particles. The bottom heatsink 30 has a bottom surface 34 defining a bottom plane for the light emitting die package 10. The bottom surface 34 of the bottom heatsink 30 can include a metalized bottom as illustrated in FIG. 1B. As illustrated, the leads 22 are bent toward the bottom plane, terminating proximal to the bottom plane.

The top heatsink 40 is coupled to the top side 24 of the leadframe 20. The top heatsink 40 defines an opening 42, the opening 42 generally surrounding the mounting pad 28. The top heatsink 40 is made of thermally conductive material and is thermally coupled to the top side 24 of the leadframe 20 but is electrically separated from the leadframe 20, the electrical separation can be accomplished by using a dielectric layer between the leadframe 20 and the bottom heatsink 40. The bottom heatsink 30 and the top heatsink 40 have generally similar lateral dimensions, or extents, and substantially overlap each other sandwiching the leadframe 20 between them. The top heatsink 40 and the bottom heatsink 30 are made with thermally conductive material such as, for example only, copper, aluminum, or ceramics material.

The light emitting die package 10 includes the LED assembly 50 including at least one light emitting device (LED) mounted on the mounting pad. In FIG. 2, the LED assembly 50 is illustrated as having four light emitting diodes. The LEDS are adapted to generate light when energized.

The light emitting die package 10 includes a reflector 60 coupled to the top heatsink 40, the reflector 60 surrounding the mounting pad 28. In an alternative embodiment, the reflector 60 is not a separate component but is integrated with and is a portion of the top heatsink 40. The reflector 60 is adapted to reflect light from the LED assembly 50 toward a lens 70.

The light emitting die package 10 includes the lens 70 coupled to the top heatsink 40, the lens 70 coupled generally over the opening 42, the mounting pad 28, and over the reflector 60. When the lens 70 is placed over the opening 42, an enclosed cavity 44 is defined by the leadframe 20, the opening 42 of the top heatsink 40, and the lens 70. The lens 70 operates on the light generated by the LED assembly 50 by, for example, reflecting, directing, focusing, and alter wavelength. For example, a bottom surface 72 of the lens 70 can be coated with calcium carbonate to diffuse the light. Alternately, the bottom surface 72 of the lens 70 can be coated with phosphors to alter wavelengths of light from the LED assembly 50.

The enclosed cavity 44 is filled by clear encapsulant such as Silicone. The encapsulant affixes the LED assembly 50 to the mounting pad 28. The enclosed cavity 44 need not be completely filled with the encapsulant. In fact, partially filling the cavity 44 with encapsulant while leaving gaps within the cavity 44 allows the encapsulant to expand (when heat is generated by the LED assembly 50) without separating the lens 70 from the top heatsink 40.

Figure 2:
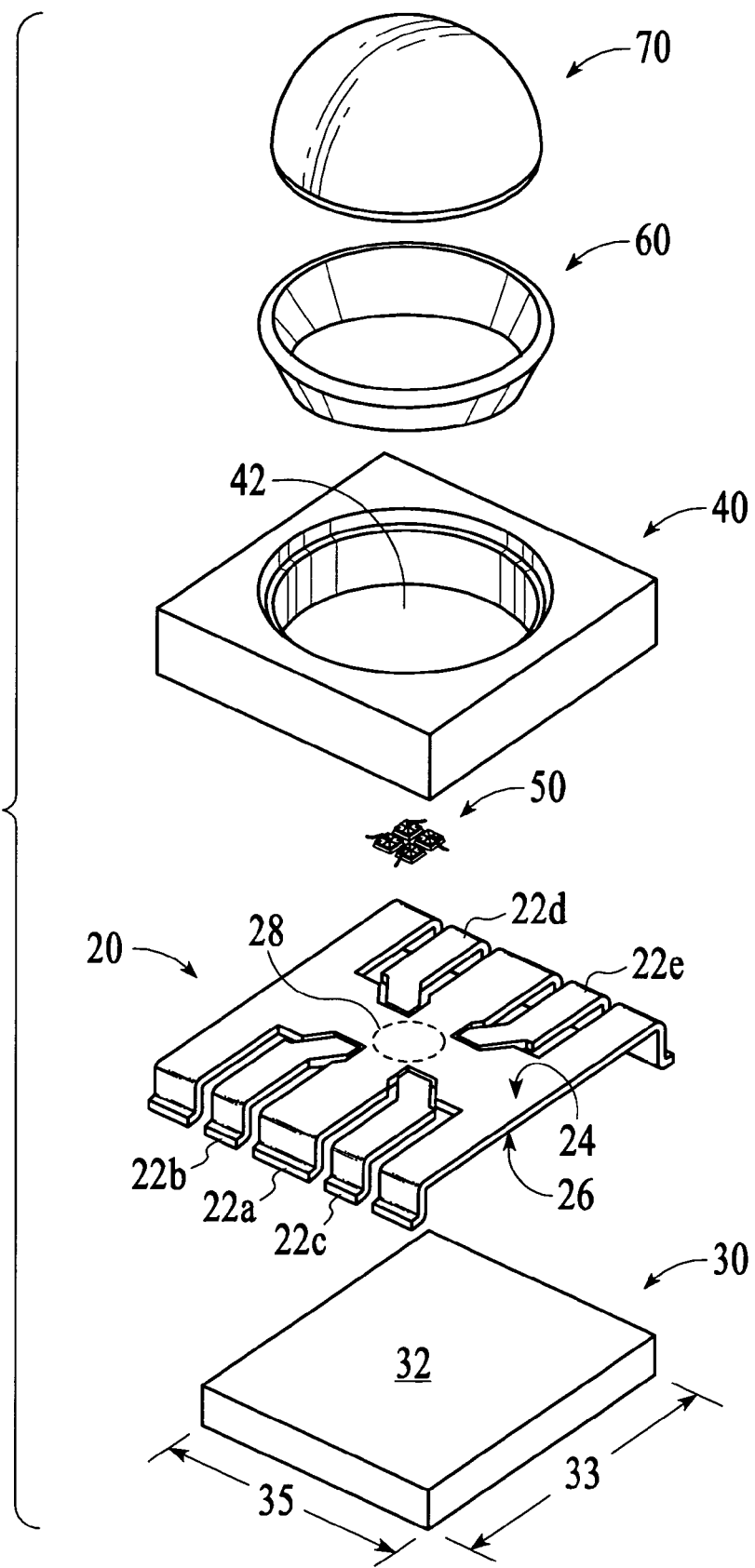
FIG. 2 is an exploded perspective view of the semiconductor package of FIG. 1A.
Figure 3:
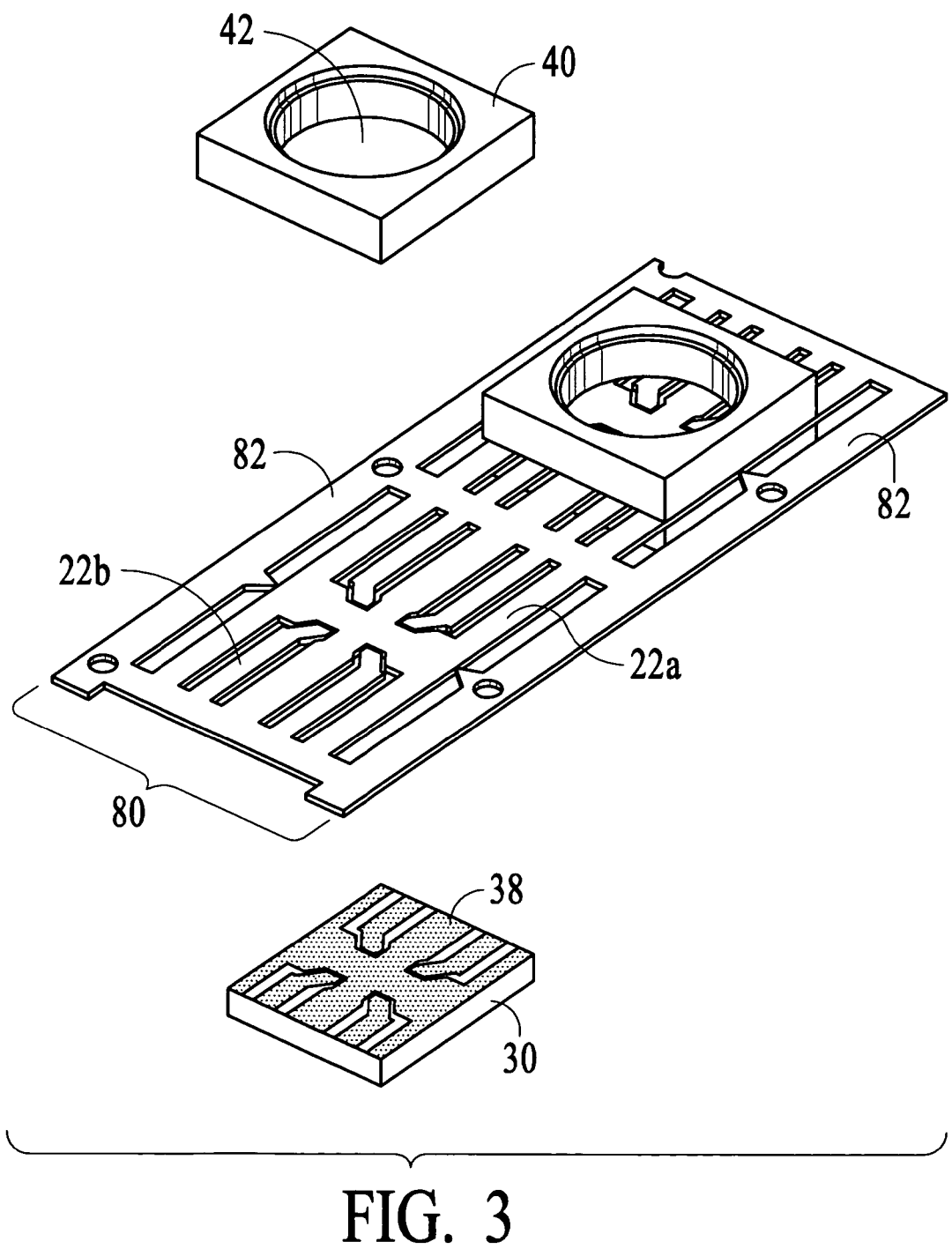
FIG. 3 is a perspective view of a light emitting die package of FIG. 1A during its manufacturing process.

The method of manufacturing the light emitting die package 10 of FIGS. 1A through 2 can be discussed using FIG. 3. FIG. 3 illustrates the light emitting die package 10 of FIG. 1A before it is manufactured. To manufacture the light emitting die package 10 of Figure, a leadframe die 80 is fabricated. For illustratively purposes, in FIG. 2, the leadframe die 80 is fabricated for manufacturing of two light emitting die packages. In fact, a leadframe die can be fabricated to manufacture multiple light emitting die packages simultaneously. The leadframe die 80 includes a plurality of leads, for example, the leads 22a, 22b, 22c, 22d, and 22e (collectively, "leads 22") and a die frame 82 surrounding the leads 22. The leadframe die has a top side 24 (that is the same side as the top side 24 of leadframe 20 of FIG. 2) and a bottom side 26 (that is the same side as the bottom side 26 of leadframe 20 of FIG. 2). The leadframe die 80 is fabricated by stamping a sheet of die material such as metal. The thickness of the die material may vary greatly depending on the desired application, for example, the thickness may be in the order of fractions of millimeters (mm), for example, ranging from 0.13 mm to 0.25 mm. Alternately, the leadframe die 80 can be fabricated using etching processes.

Referring to FIGS. 2 and 3, the top heatsink 40 is coupled to the leadframe die 80. As already described, the top heatsink 40 defined the opening 42. The bottom heatsink 30 is coupled to the bottom side of the leadframe die 80. The bottom heatsink 30 has a top surface 32 thermally coupled to but is electrically separated from the leadframe die 80. As illustrated in FIG. 1B, the bottom heatsink 30 has a metalized bottom surface 34 defining a bottom plane for the light emitting die package 30. Dielectric but thermally conductive adhesive layer 38 of FIG. 3 may be used to separate the bottom heatsink 30 from the leadframe 20.

The top heatsink 40 and the bottom heatsink 30 have similar lateral extents and substantially overlap each other. For example, the later extents 33 and 35 of the bottom heatsink 30 may vary widely depending on the implementation, for example only, the lateral extents 33 and 35 may be in the order of mm or centimeters (cm), and may range from, for example, seven mm to 20 mm. The bottom heatsink 30 and the top heatsink 40 may have thicknesses in the order of mm or cm, and may range from, for example, 1.5 mm to three mm. These measurements may vary greatly depending on various desired characteristics and applications.

Referring to FIGS. 2 and 3, the method of manufacturing the light emitting die package 10 is further discussed. The LED assembly 50 including at least one light emitting device (LED) such as a light emitting diode is mounted on at least one lead, such as the lead 22a, within the opening 42. Then, the reflector 60 and the lens 70 are attached on the top heatsink 40, the lens 70 covering the opening 42. The reflector 60 surrounds the opening 42. The reflector 60 may be integrated with the top heatsink 40 in which case there is no need for a separate step of coupling the reflector 60 with the top heatsink 40.

Finally, the leadframe die 80 is stamped to cut away the die frame 82. During the stamping, the leads 22 are bent towards the bottom plane as illustrated in FIGS. 1A through 2.

From the foregoing, it will be apparent that the present invention is novel and offers advantages over the current art. Although specific embodiments of the invention are described and illustrated above, the invention is not to be limited to the specific forms or arrangements of parts so described and illustrated. For example, differing configurations, sizes, or materials may be used to practice the present invention. The invention is limited by the claims that follow.

What is claimed is:

1. A light emitting die package comprising:
    a leadframe including a plurality of leads, said leadframe having top side and bottom side, and a portion of said leadframe defining a mounting pad;
    a bottom heatsink coupled to the bottom side of said leadframe, said bottom heatsink having a top surface thermally coupled to but electrically separated from said leadframe;
    a top heatsink coupled to the top side of said leadframe, said top heatsink defining an opening, the opening generally surrounding the mounting pad; and
    at least one dielectric layer positioned between said leadframe and at least one of the top heatsink and the bottom heatsink;
    wherein said top heatsink and said bottom heatsink have similar lateral dimensions, and said leadframe has lateral dimensions that are at least as great as lateral dimensions of said top heatsink and said bottom heatsink both widthwise and lengthwise.

2. The light emitting die package recited in claim 1 wherein said top heatsink is electrically separated from said leadframe by a dielectric layer positioned between said leadframe and said top heatsink.

3. The light emitting die package recited in claim 1 wherein said bottom heatsink has a metalized bottom surface defining a bottom plane for the light emitting die package.

4. The light emitting die package recited in claim 3 wherein the leads are bent toward the bottom plane, and the leads terminate proximal to the bottom plane.

5. The light emitting die package recited in claim 1 further comprising at least one light emitting device (LED) mounted on the mounting pad.

6. The light emitting die package recited in claim 1 further comprising a reflector coupled to said top heatsink, said reflector surrounding the mounting pad.

7. The light emitting die package recited in claim 1 further comprising a lens coupled to said top heatsink over the mounting pad.

8. The light emitting die package recited in claim 7 wherein an enclosed cavity is defined by the opening and said lens.

9. The light emitting die package recited in claim 1 wherein said bottom heatsink comprises a thermally conductive material.

10. The light emitting die package recited in claim 2 wherein said top heatsink comprises a thermally conductive material.

11. A light emitting die package comprising:
    a leadframe including a plurality of leads, said leadframe having top side and a bottom side, and a portion of said leadframe defining a mounting pad;
    a thermally conductive bottom heatsink thermally coupled to the bottom side of said leadframe under the mounting pad, said bottom heatsink electrically insulated from said leadframe by a dielectric layer positioned between said leadframe and said bottom heatsink;
    a thermally conductive top heatsink thermally coupled to the top side of said leadframe, said top heatsink defining an opening, the opening generally surrounding the mounting pad, said top heatsink electrically insulated from said leadframe by a dielectric layer positioned between said leadframe and said top heatsink, and said top heatsink coupled to a reflector also surround the mounting pad;

at least one dielectric layer positioned between said leadframe and at least one of the top heatsink and the bottom heatsink;

at least one light emitting device (LED) mounted on the mounting pad, the LED adapted to generate light when energized; and a lens coupled to said top heatsink over the opening, said lens adapted to operate on the light generated by the LED, the lens, covering the opening thereby defining an enclosed cavity;

wherein said top heatsink and said bottom heatsink have similar lateral dimensions, and said leadframe has lateral dimensions that are at least as great as the lateral dimensions of said top heatsink and said bottom heatsink both widthwise and lengthwise.

12. The light emitting die package recited in claim 11 wherein said bottom heatsink has a metalized bottom surface defining a bottom plane for the light emitting die package.

13. The light emitting die package recited in claim 12 wherein the leads are bent toward the bottom plane, and the leads terminate proximal to the bottom plane.

14. The light emitting die package recited in claim 11 wherein the enclosed cavity is at least partially filled with encapsulant.

15. A light emitting device comprising:

a leadframe having top side and bottom side, a portion of said leadframe defining a mounting pad;

a bottom heatsink coupled to the bottom side of said leadframe, said bottom heatsink having a top surface thermally coupled to but electrically separated from said leadframe; and a top heatsink thermally coupled to the top side of said leadframe wherein at least one of said top heatsink and said bottom heatsink is made with copper or aluminum.

16. The device of claim 15 further comprising a lens covering said mounting pad.

17. The device of claim 15 wherein said top heat sink further comprises an opening generally surrounding the mounting pad.

18. A light emitting device comprising:

a leadframe comprising a top side and bottom side;

a bottom heatsink coupled to the bottom side of said leadframe, said bottom heatsink having a top surface thermally coupled to but electrically separated from said leadframe;

a top heatsink coupled to the top side of said leadframe; and at least one dielectric layer positioned between said leadframe and at least one of the top heatsink and the bottom heatsink;

wherein at least one of said top heatsink and said bottom heatsink is made with copper or aluminum.

19. The device of claim 18 further comprising a mounting pad on said leadframe and a lens covering said mounting pad.

20. The device of claim 18 wherein said top heat sink further comprises an opening generally surrounding the mounting pad.

* * * * *